United States Patent
LaFarre et al.

(10) Patent No.: US 9,798,251 B2
(45) Date of Patent: Oct. 24, 2017

(54) OBJECT HOLDER, LITHOGRAPHIC APPARATUS, DEVICE MANUFACTURING METHOD, AND METHOD OF MANUFACTURING AN OBJECT HOLDER

(71) Applicant: ASML Netherlands B.V., Veldhoven (NL)

(72) Inventors: Raymond Wilhelmus Louis LaFarre, Helmond (NL); Satish Achanta, Leuven (BE); Matteo Filippi, Eindhoven (NL); Yogesh Karade, Eindhoven (NL); Antonius Johannes Maria Nellissen, Horst (NL); Ronald Van Der Wilk, Knegsel (NL); Hendrikus Christoffel Maria Van Doremalen, Nuenen (NL); Wilhelmus Jacobus Johannes Welters, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 151 days.

(21) Appl. No.: 14/772,721

(22) PCT Filed: Feb. 26, 2014

(86) PCT No.: PCT/EP2014/053700
§ 371 (c)(1),
(2) Date: Sep. 3, 2015

(87) PCT Pub. No.: WO2014/154428
PCT Pub. Date: Oct. 2, 2014

(65) Prior Publication Data
US 2016/0018744 A1    Jan. 21, 2016

(30) Foreign Application Priority Data
Mar. 27, 2013 (NL) ...................................... 2010527

(51) Int. Cl.
 G03B 27/58 (2006.01)
 G03F 7/20 (2006.01)
(52) U.S. Cl.
 CPC ...... *G03F 7/70716* (2013.01); *G03F 7/70708* (2013.01)
(58) Field of Classification Search
 CPC ............. G03F 7/70708; G03F 7/70716; H01L 21/304; H01L 21/31138
 (Continued)

(56) References Cited

U.S. PATENT DOCUMENTS 6,534,380 B1 * 3/2003 Yamauchi ......... H01L 21/76254
                                                   257/E21.568
6,952,253 B2   10/2005 Lof et al.
(Continued)

FOREIGN PATENT DOCUMENTS

EP   1 391 786    2/2004
EP   2 525 389    11/2012
(Continued)

OTHER PUBLICATIONS

Chinese Office Action dated Feb. 6, 2017 in corresponding Chinese Patent Application No. 201480018352.8.
(Continued)

*Primary Examiner* — Peter B Kim
(74) *Attorney, Agent, or Firm* — Pillsbury Winthrop Shaw Pittman LLP

(57) ABSTRACT

A method of manufacturing an object holder for use in a lithographic apparatus, the object holder including one or more electrically functional components, the method including: using a composite structure including a carrier sheet different from a main body of the object holder and a layered structure including one or a plurality of layers and formed on the carrier sheet; connecting the composite structure to a
(Continued)

surface of the main body such that the layered structure is between the carrier sheet and the surface of the main body; and removing the carrier sheet from the composite structure, leaving the layered structure connected to the main body.

20 Claims, 10 Drawing Sheets

(58) Field of Classification Search
USPC .......................................................... 355/72
See application file for complete search history.

(56) References Cited

U.S. PATENT DOCUMENTS

| | | | |
|---|---|---|---|
| 7,701,550 | B2 | 4/2010 | Kemper et al. |
| 8,351,018 | B2 | 1/2013 | Direcks et al. |
| 8,421,993 | B2 | 4/2013 | Direcks et al. |
| 8,634,053 | B2 | 1/2014 | Riepen et al. |
| 9,036,127 | B2 | 5/2015 | Van Den Dungen et al. |
| 9,329,497 | B2 | 5/2016 | Albert et al. |
| 2004/0207824 | A1 | 10/2004 | Lof et al. |
| 2006/0038968 | A1 | 2/2006 | Kemper et al. |
| 2007/0210313 | A1 | 9/2007 | Park |
| 2008/0151467 | A1 | 6/2008 | Simpson |
| 2008/0212046 | A1 | 9/2008 | Riepen et al. |
| 2009/0262318 | A1 | 10/2009 | Van Den Dungen et al. |
| 2009/0279060 | A1 | 11/2009 | Direcks et al. |
| 2009/0279062 | A1 | 11/2009 | Direcks et al. |
| 2011/0222033 | A1 | 9/2011 | Ten Kate et al. |
| 2011/0227086 | A1 | 9/2011 | French |
| 2012/0212725 | A1 | 8/2012 | Lafarre et al. |
| 2012/0274920 | A1 | 11/2012 | Bex et al. |
| 2013/0301028 | A1 | 11/2013 | Albert et al. |

FOREIGN PATENT DOCUMENTS

| | | |
|---|---|---|
| WO | 99/49504 | 9/1999 |
| WO | 2012/005294 | 1/2012 |
| WO | 2012/103967 | 8/2012 |

OTHER PUBLICATIONS

International Search Report mailed Nov. 5, 2014 in corresponding International Patent Application No. PCT/EP2014/053700.
R. Dekker et al., "A 10 um Thick RF-ID Tag for Chip-in-Paper Applications," Proceedings of the Bipolar/BiCMOS Circuits and Technology Meeting, pp. 18-21 (Oct. 9-11, 2005).
R. Dekker et al., "Circonflex: an Ultra-Thin and Flexible Technology for RF-ID Tags," European Microelectronics and Packaging Conference at Brugge, Belgium, pp. 268-271 (Jun. 12-15, 2005).
B. Mimoun et al., "Mechanical study of silicon nitride layers on thin flexible substrates under bending," Proc. of 12th Workshop on Semiconductors Advances for Future Electronics and Sensors (SAFE 2009), pp. 95-98 (Nov. 2009).
Chinese Office Action dated Jun. 27, 2016 in corresponding Chinese Patent Application No. 201480018352.8.
Korean Office Action dated Aug. 17, 2016 in corresponding Korean Patent Application No. 10-2015-7031003.

\* cited by examiner

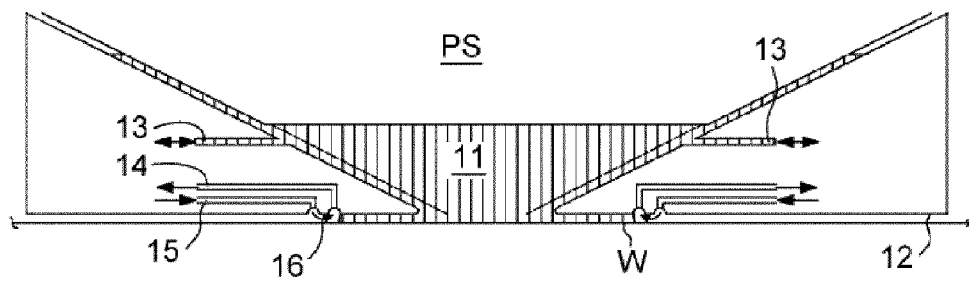
FIG. 5
FIG. 6
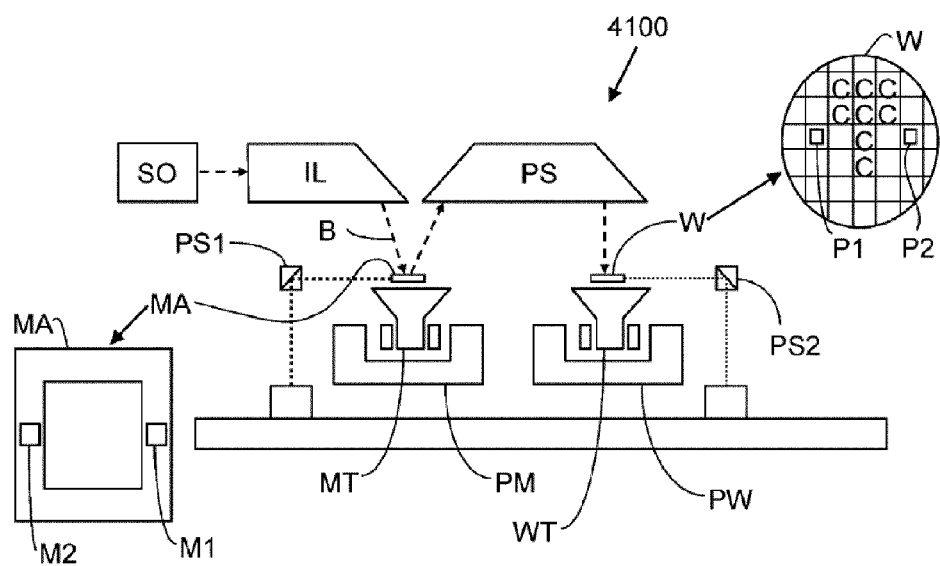

OBJECT HOLDER, LITHOGRAPHIC APPARATUS, DEVICE MANUFACTURING METHOD, AND METHOD OF MANUFACTURING AN OBJECT HOLDER

This application is the U.S. national phase entry of PCT patent application no. PCT/EP2014/053700, which was filed on Feb. 26, 2014, and claims the benefit of priority of Netherlands Patent Application No. 2010527, which was filed on Mar. 27, 2013.

FIELD

The present invention relates to a substrate holder or patterning device holder, a lithographic apparatus, a device manufacturing method, and a method of manufacturing a substrate holder or patterning device holder.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

SUMMARY

In a conventional lithography apparatus, the substrate to be exposed may be supported by a substrate holder which in turn is supported by a substrate table. The substrate holder is often a flat rigid disc corresponding in size and shape to the substrate (although it may have a different size or shape). It has an array of projections, referred to as burls or pimples, projecting from at least one side. In an embodiment, the substrate holder has an array of projections on two opposite sides. In this case, when the substrate holder is placed on the substrate table, the main body of the substrate holder is held a small distance above the substrate table while the ends of the burls on one side of the substrate holder lie on the surface of the substrate table. Similarly, when the substrate rests on the top of the burls on the opposite side of the substrate holder, the substrate is spaced apart from the main body of the substrate holder. The purpose of this is to help prevent a particle (i.e. a contaminating particle such as a dust particle) which might be present on either the substrate table or substrate holder from distorting the substrate holder or substrate. Since the total surface area of the burls is only a small fraction of the total area of the substrate or substrate holder, it is highly probable that any particle will lie between burls and its presence will have no effect. Often, the substrate holder and substrate are accommodated within a recess in the substrate table so that the upper surface of the substrate is substantially coplanar with the upper surface of the substrate table.

Due to the high accelerations experienced by the substrate in use of a high-throughput lithographic apparatus, it is not sufficient to allow the substrate simply to rest on the burls of the substrate holder. It is clamped in place. Two methods of clamping the substrate in place are known—vacuum clamping and electrostatic clamping. In vacuum clamping, the space between the substrate holder and substrate and optionally between the substrate table and substrate holder are partially evacuated so that the substrate is held in place by the higher pressure of gas or liquid above it. Vacuum clamping however may not be used where the beam path and/or the environment near the substrate or substrate holder is kept at a low or very low pressure, e.g. for extreme ultraviolet (EUV) radiation lithography. In this case, it may not be possible to develop a sufficiently large pressure difference across the substrate (or substrate holder) to clamp it. Electrostatic clamping may therefore be used. In electrostatic clamping, a potential difference is established between the substrate, or an electrode plated on its lower surface, and an electrode provided on the substrate table and/or substrate holder. The two electrodes behave as a large capacitor and substantial clamping force can be generated with a reasonable potential difference. An electrostatic arrangement can be such that a single pair of electrodes, one on the substrate table and one on the substrate, clamps together the complete stack of substrate table, substrate holder and substrate. In an arrangement, one or more electrodes may be provided on the substrate holder so that the substrate holder is clamped to the substrate table and the substrate is separately clamped to the substrate holder.

An electrostatic clamp may also be used to clamp the patterning device to a patterning device holder.

An isolation layer may be provided between the substrate holder and the substrate or between the substrate holder and the substrate table, or both. In the case of a clamp for a patterning device, an isolation layer may be provided between the patterning device holder and the patterning device, between the patterning device and a support structure for the patterning device (where provided as an element separate from the patterning device holder), or both. The isolation layer acts to inhibit transfer of charge between the elements being clamped, which would reduce the clamping force. Imperfections in the isolation layer can reduce the performance of the electrostatic clamp.

Pinhole imperfections might be introduced during deposition of the isolation layer. Anodic bonding processes may introduce stresses into the isolation layer. Stresses can cause cracks in the layer or deformation in the layer. Pinholes and cracks will tend to reduce the voltage breakdown strength of the isolation layer, which tends to increase the thickness of isolation layer required for the clamp to operate without voltage breakdown. Increasing the thickness of the isolation layer increases the operational voltage required for the clamp, which tends to reduce efficiency. Deformation of the isolation layer or variations in the thickness of the isolation layer caused by inaccuracies in the deposition process (caused for example by the presence of burls on the deposition surface) may cause spatial variations in the clamping force provided by the clamp. Spatial variations in the clamping force can lead to overlay or focus errors. Imperfections in the isolation layer can also reduce the durability of the isolation layer.

Temperature control over the substrate surface is significant, in particular in immersion systems which are sensitive to temperature variations due to liquid (e.g. water) evaporation effects. Evaporation of liquid from a substrate may apply a heat load to the substrate, leading to the temperature variations. The temperature variations lead to thermal stress in the substrate which eventually may contribute to overlay error. To achieve improved accuracy in temperature control, real time local measurement of the temperature combined with active heating is desired. Such a measurement and heating system is integrated into the system, i.e. in the substrate holder (i.e. the object that directly supports a substrate) and/or substrate table (mirror block or stage, i.e. the object such as table that supports the substrate holder and provides the upper surface surrounding the substrate holder). A thin film stack can be used to make a structure that can both measure and heat. Such a structure offers the opportunity for integration into the substrate table or both.

Variations in the distance between the substrate and heaters or between the substrate and temperature sensors can reduce the accuracy of temperature control.

Forming electrically functional components such as sensors and heaters directly on the main body of the substrate holder can lead to relatively low yield because it is not possible adequately to test the components before they are formed. Thin film devices are prone to malfunction and need to be tested before use for reliability.

An electrical grounding layer may be provided adjacent to the substrate. For example, a layer of CrN may be provided that is patterned in order to run over the upper surfaces of projections (also referred to as "burls") on the substrate table. Such a grounding layer may need to be relatively thick (e.g. greater than 1 micron thick) in order to allow for tuning of roughness and/or flatness. Such thick layers may be prone to delamination. To prevent sticking of the substrate to the grounding layer the grounding layer may be roughened, for example using ion beam figuring. The grounding layer may also need to be wear resistant. The need for the layer to be compatible with roughening processes such as ion beam figuring and/or to be wear resistant, limits the range of materials that can be used to form the grounding layer. This may lead the material being sub-optimal in certain respects, for example expensive or difficult to apply reliably in the required thicknesses.

It is desirable, for example, to provide a substrate holder which facilitates improved electrostatic clamping performance, improved substrate temperature control, improved yield, or any combination of these. Alternatively or additionally, it is desirable to provide a substrate holder that includes a grounding layer that is more easily or cheaply manufactured and/or which is more reliable.

According to an aspect of the invention, there is provided a method of manufacturing an object holder for use in a lithographic apparatus, the object holder comprising one or more electrically functional components, the method comprising: using a composite structure comprising a carrier sheet different from a main body of the object holder and a layered structure comprising one or a plurality of layers and formed on the carrier sheet; connecting the composite structure to a surface of the main body such that the layered structure is between the carrier sheet and the surface of the main body; and removing the carrier sheet from the composite structure, leaving the layered structure connected to the main body.

According to an aspect, there is provided an object holder for supporting an object and for use in a lithographic apparatus, comprising: a main body; one or more electrically functional components; an adhesive layer formed on a surface of the main body; and a layered structure comprising one or a plurality of layers and connected to the main body via the adhesive layer, wherein the layered structure comprises a SiO2 layer formed by thermal oxidation of a silicon surface of a substrate.

According to an aspect, there is provided an object holder for a lithographic apparatus, comprising: a plurality of projections protruding from a base surface of the object holder, each projection having a proximal end at the base surface and a distal end furthest from the base surface; an electrode adapted either to electrostatically clamp an object to be supported by the object holder against the projections, such that the object is held in contact with the distal ends of the projections, or to electrostatically clamp the object holder to an object table adapted to support the object holder, such that the object table is held in contact with the distal ends of the projections; a grounding layer adapted to electrically connect two or more of the projections to ground or a common electrical potential; and a dielectric layer, wherein the grounding layer comprises a portion that is in between the dielectric layer and at least one of the plurality of projections that is/are connected to ground or the common electrical potential by the grounding layer.

According to an aspect, there is provided a method of manufacturing an object holder for a lithographic apparatus, comprising: forming a plurality of projections protruding from a base surface, each projection having a proximal end at the base surface and a distal end furthest from the base surface; forming an electrode adapted either to electrostatically clamp an object to be supported by the object holder against the projections, such that the object is held in contact with the distal ends of the projections, or to electrostatically clamp the object holder to an object table adapted to support the object holder, such that the object table is held in contact with the distal ends of the projections; forming a grounding layer adapted to electrically connect two or more of the projections to ground or a common electrical potential; and forming a dielectric layer, wherein the grounding layer is formed so as to comprise a portion that is in between the dielectric layer and at least one of the plurality of projections that is/are connected to ground or the common electrical potential by the grounding layer.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts, in cross-section, a barrier member which may be used in an embodiment of the present invention as an immersion liquid supply system;

FIG. 6 depicts a lithographic apparatus according to an embodiment of the invention;

DETAILED DESCRIPTION

Figure 1:
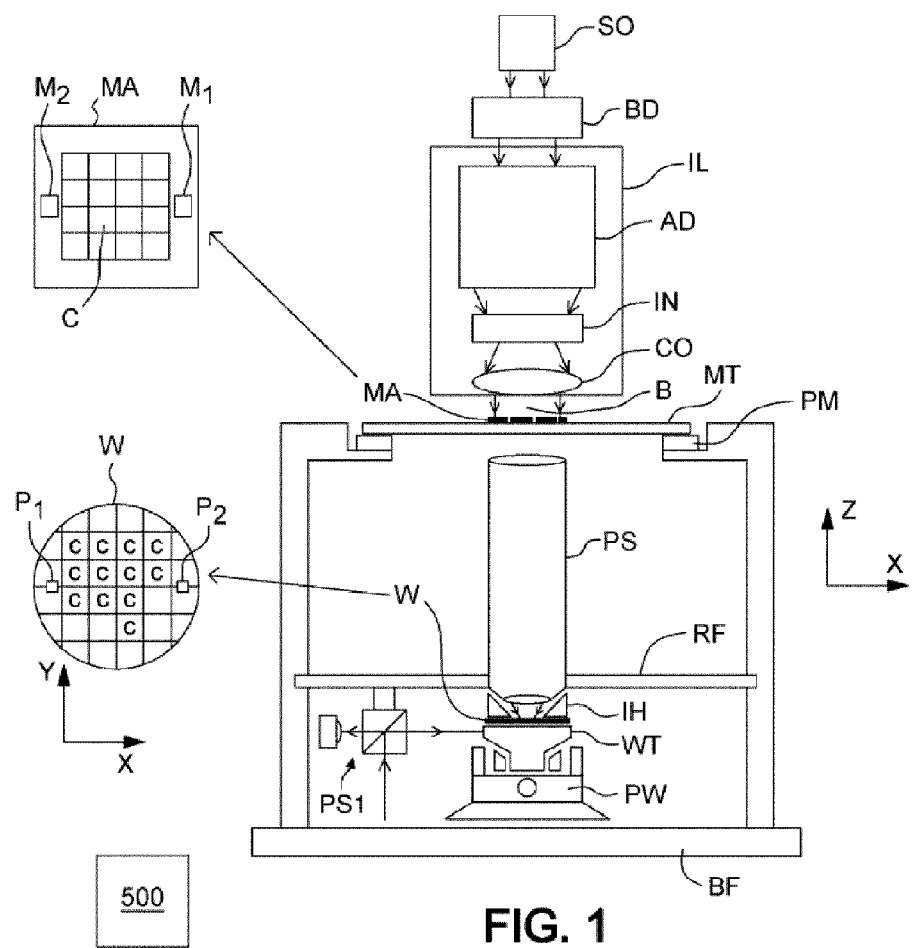
FIG. 1 depicts a lithographic apparatus according to an embodiment of the invention.

FIGS. 1 and 6 schematically depicts a lithographic apparatus according to an embodiment of the invention. The apparatus comprises:

an illumination system (illuminator) IL configured to condition a radiation beam B (e.g. UV radiation, DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters. A substrate holder as described herein can be used to hold the substrate W on the substrate table WT; and a projection system (e.g. a refractive or reflective projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein, like the term "illumination system", should be broadly interpreted as encompassing any type of projection system, including refractive, reflective, catadioptric, magnetic, electromagnetic and electrostatic optical systems or other types of optical components, or any combination thereof, as appropriate for the exposure radiation being used, or for other factors such as the use of an immersion liquid or the use of a vacuum. Any use of the term "projection lens" herein may be considered as synonymous with the more general term "projection system". The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As depicted in FIG. 1, the apparatus is of a transmissive type (e.g. employing a transmissive mask). Alternatively, as depicted in FIG. 6, the apparatus may be of a reflective type (e.g. employing a programmable mirror array of a type as referred to above, or employing a reflective mask).

The lithographic apparatus may be of a type having two or more tables (or stage(s) or support(s)) which may be referred to as dual stage, e.g., two or more substrate tables or a combination of one or more substrate tables and one or more sensor or measurement tables. In such "multiple stage" machines the additional tables may be used in parallel, or preparatory steps may be carried out on one or more tables while one or more other tables are being used for exposure. The lithographic apparatus may have two or more patterning device tables (or stage(s) or support(s)) which may be used in parallel in a similar manner to substrate, sensor and measurement tables.

Referring to FIGS. 1 and 6, the illuminator IL receives a radiation beam from a radiation source SO in FIG. 1 or a source collector apparatus SO in FIG. 6. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the desired line-emitting element, with a laser beam. The source collector apparatus SO may be part of an EUV radiation system including a laser, not shown in FIG. 6, to provide the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation. In such cases, the laser is not considered to form part of the lithographic apparatus and the radiation beam is passed from the laser to the source collector apparatus with the aid of a beam delivery system comprising, for example, suitable directing mirrors and/or a beam expander. In other cases the source may be an integral part of the source collector apparatus, for example when the source is a discharge produced plasma EUV generator, often termed as a DPP source.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN, a condenser CO, a facetted field mirror device and/or a pupil mirror device. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor PS1 (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 7:
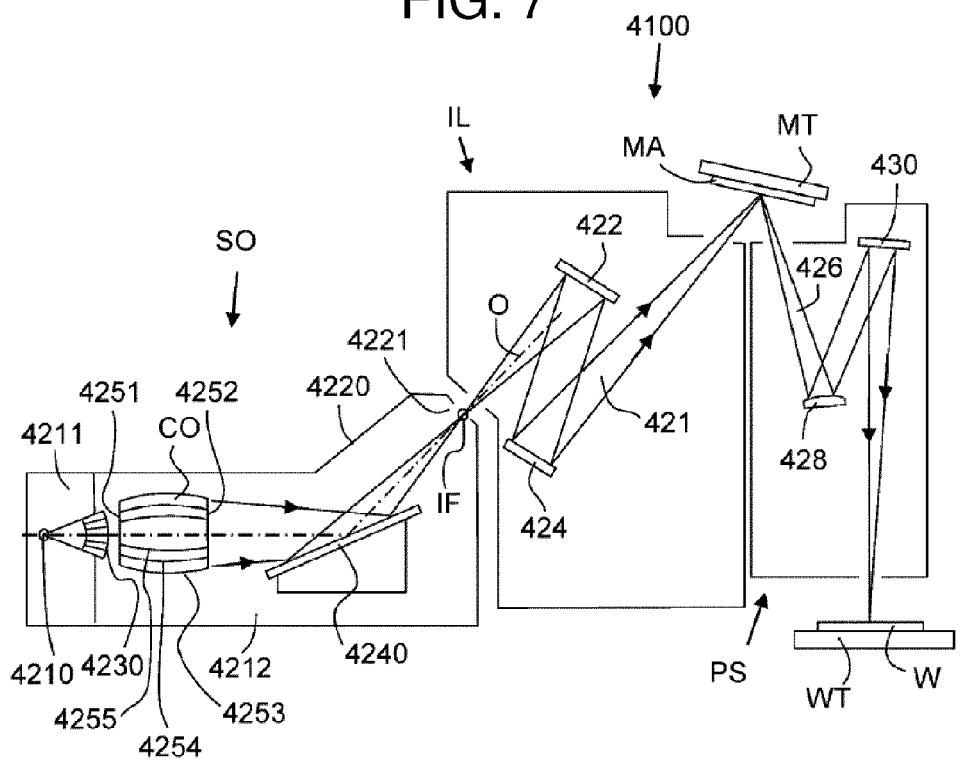
FIG. 7 is a more detailed view of the apparatus of FIG. 6.

FIG. 7 shows the EUV apparatus 4100 in more detail, including the source collector apparatus SO, the illumination system IL, and the projection system PS. The source collector apparatus SO is constructed and arranged such that a vacuum environment can be maintained in an enclosing structure 4220 of the source collector apparatus SO. An EUV radiation emitting plasma 4210 may be formed by a discharge produced plasma source. EUV radiation may be produced by a gas or vapor, for example Xe gas, Li vapor or Sn vapor in which the very hot plasma 4210 is created to emit radiation in the EUV range of the electromagnetic spectrum. The very hot plasma 4210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 4210 is passed from a source chamber 4211 into a collector chamber 4212 via an optional gas barrier or contaminant trap 4230 (in some cases also referred to as contaminant barrier or foil trap) which is positioned in or behind an opening in source chamber 4211. The contaminant trap 4230 may include a channel structure. Contaminant trap 4230 may include a gas barrier or a combination of a gas barrier and a channel structure. The contaminant trap or contaminant barrier 4230 further indicated herein at least includes a channel structure, as known in the art.

The collector chamber 4212 may include a radiation collector CO which may be a so-called grazing incidence collector. Radiation collector CO has an upstream radiation collector side 4251 and a downstream radiation collector side 4252. Radiation that traverses collector CO can be reflected off a grating spectral filter 4240 to be focused in a virtual source point IF. The virtual source point IF is commonly referred to as the intermediate focus, and the source collector apparatus is arranged such that the intermediate focus IF is located at or near an opening 4221 in the enclosing structure 4220. The virtual source point IF is an image of the radiation emitting plasma 4210.

Subsequently the radiation traverses the illumination system IL, which may include a facetted field mirror device 422 and a facetted pupil mirror device 424 arranged to provide a desired angular distribution of the radiation beam 421, at the patterning device MA, as well as a desired uniformity of radiation intensity at the patterning device MA. Upon reflection of the beam of radiation 421 at the patterning device MA, held by the support structure MT, a patterned beam 426 is formed and the patterned beam 426 is imaged by the projection system PS via reflective elements 428, 430 onto a substrate W held by the substrate table WT.

More elements than shown may generally be present in illumination optics unit IL and projection system PS. The grating spectral filter 4240 may optionally be present, depending upon the type of lithographic apparatus. There may be more mirrors present than those shown in the Figures, for example there may be 1-6 additional reflective elements present in the projection system PS than shown in FIG. 7.

Collector optic CO, as illustrated in FIG. 7, is depicted as a nested collector with grazing incidence reflectors 4253, 4254 and 4255, just as an example of a collector (or collector mirror). The grazing incidence reflectors 4253, 4254 and 4255 are disposed axially symmetric around an optical axis O and a collector optic CO of this type is preferably used in combination with a discharge produced plasma source, often called a DPP source.

Figure 8:
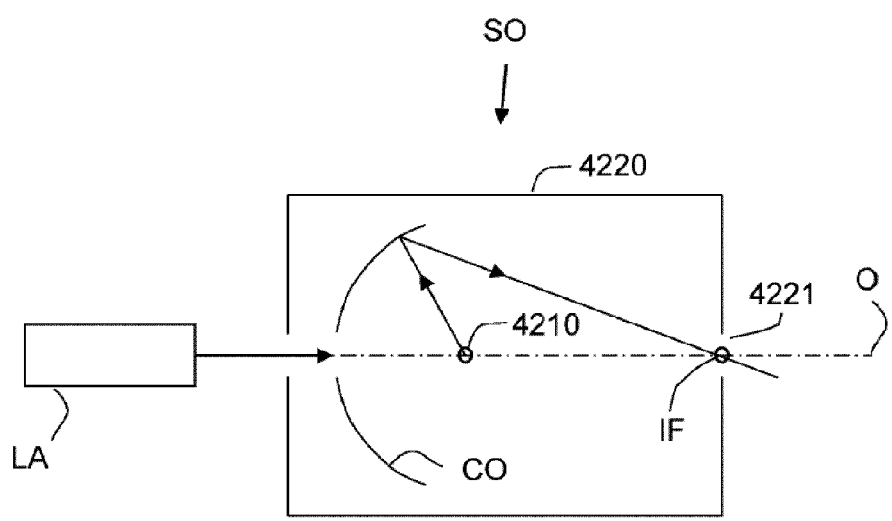
FIG. 8 is a more detailed view of the source collector of the apparatus of FIGS. 6 and 7.

Alternatively, the source collector apparatus SO may be part of an LPP radiation system as shown in FIG. 8. A laser LA is arranged to deposit laser energy into a fuel, such as xenon (Xe), tin (Sn) or lithium (Li), creating the highly ionized plasma 4210 with electron temperatures of several ten's of eV. The energetic radiation generated during de-excitation and recombination of these ions is emitted from the plasma, collected by a near normal incidence collector optic CO and focused onto the opening 4221 in the enclosing structure 4220.

In many lithographic apparatus a fluid, in particular a liquid for example an immersion lithographic apparatus, is provided between the final element of the projection system using a liquid supply system IH to enable imaging of smaller features and/or increase the effective NA of the apparatus. An embodiment of the invention is described further below with reference to such an immersion apparatus, but may equally be embodied in a non-immersion apparatus. Arrangements to provide liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. Another arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate.

Four different types of localized liquid supply systems are illustrated in FIGS. 2-5. Any of the liquid supply devices of FIGS. 2-5 may be used in an unconfined system; however, sealing features are not present, are not activated, are not as efficient as normal or are otherwise ineffective to seal liquid to only the localized area.

Figure 2:
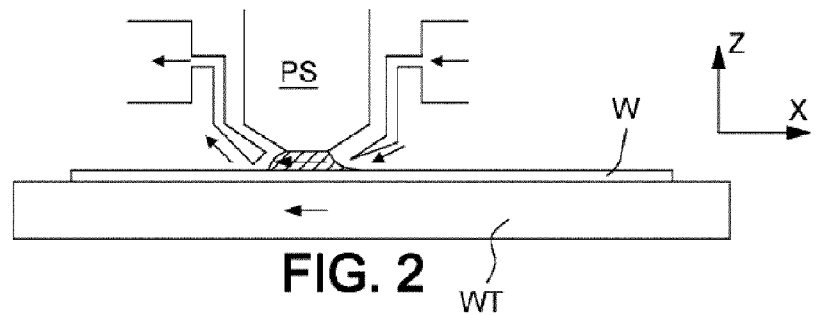
FIGS. 2 and 3 depict a liquid supply system for use in a lithographic projection apparatus.
Figure 3:
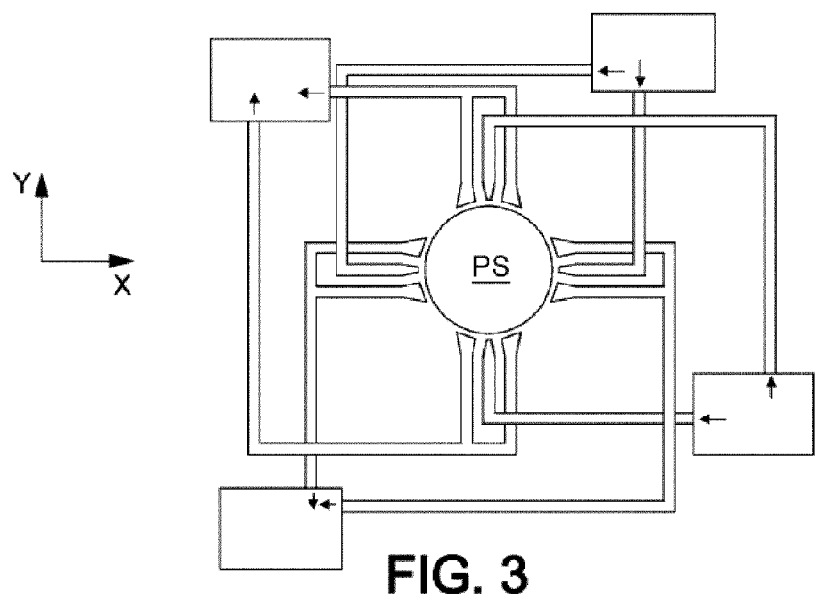

One of the arrangements proposed for a localized immersion system is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side.

FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
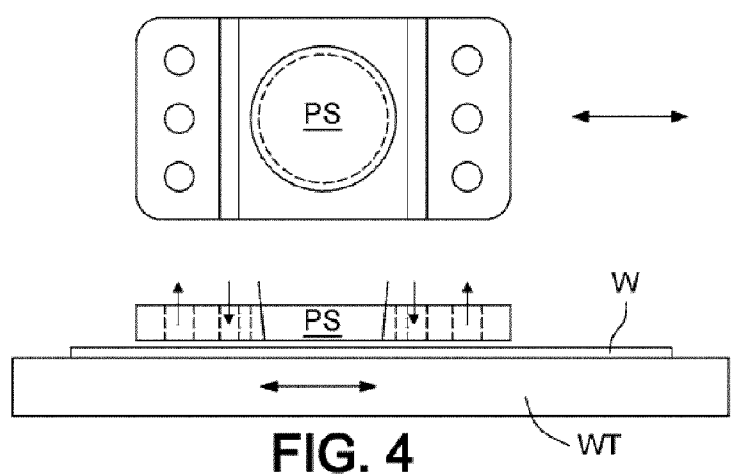
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824, which document is incorporated herein by reference in its entirety.

FIG. 5 schematically depicts a localized liquid supply system with a fluid handling structure 12. The fluid handling structure extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The fluid handling structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the fluid handling structure 12 and the surface of the substrate W. The gas seal is formed by gas, e.g. air or synthetic air but, in an embodiment, N₂ or another inert gas. The gas in the gas seal is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which document is incorporated herein by reference in its entirety.

The example of FIG. 5 is a localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968, which document is incorporated herein by reference in its entirety.

Another arrangement which is possible is one which works on a gas drag principle. The so-called gas drag principle has been described, for example, in United States patent application publication nos. US 2008-0212046, US 2009-0279060, and US 2009-0279062, which documents are incorporated herein by reference in its entirety. In that system the extraction holes are arranged in a shape which desirably has a corner. The corner may be aligned with the stepping or scanning directions. This reduces the force on the meniscus between two openings in the surface of the fluid handing structure for a given speed in the step or scan direction compared to if the two outlets were aligned perpendicular to the direction of scan.

Also disclosed in US 2008-0212046, which document is incorporated herein by reference in its entirety, is a gas knife positioned radially outside the main liquid retrieval feature. The gas knife traps any liquid which gets past the main liquid retrieval feature. Such a gas knife may be present in a so called gas drag principle arrangement (as disclosed in US 2008-0212046, which document is incorporated herein by reference in its entirety), in a single or two phase extractor arrangement (such as disclosed in United States patent application publication no. US 2009-0262318, which document is incorporated herein by reference in its entirety) or any other arrangement.

Many other types of liquid supply system are possible. The present invention is neither limited to any particular type of liquid supply system, nor to immersion lithography. The invention may be applied equally in any lithography. In an EUV lithography apparatus, the beam path is substantially evacuated and immersion arrangements described above are not used.

A control system 500 shown in FIG. 1 controls the overall operations of the lithographic apparatus and in particular performs an optimization process described further below. Control system 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system 500 may also be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

Figure 9:
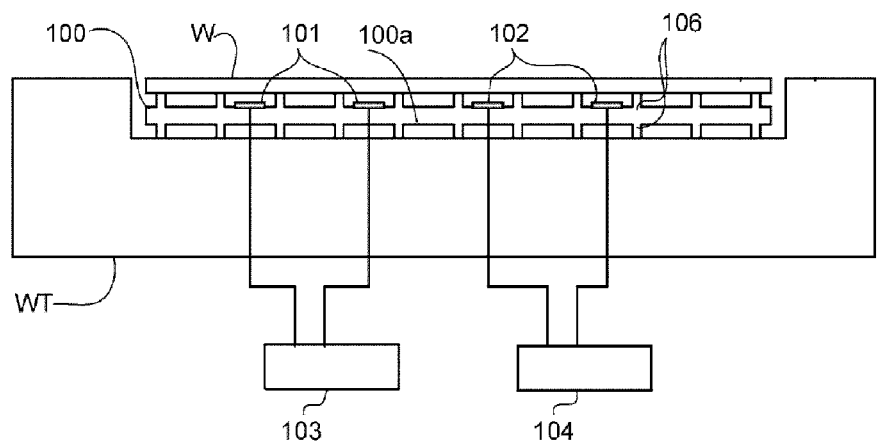
FIG. 9 depicts in cross-section a substrate table and a substrate holder according to an embodiment of the invention.

FIG. 9 depicts a substrate holder 100 according to an embodiment of the invention. It may be held within a recess in substrate table WT and supports substrate W. The main body of the substrate holder 100a, in an embodiment, is substantially flat and corresponds in shape and size to the substrate W, e.g., a flat plate, for example a disc. At least on a top side, in an embodiment on both sides, the substrate holder has projections 106, commonly referred to as burls. In an embodiment, the substrate holder is an integral part of the substrate table and does not have burls on the lower surface. The burls are not shown to scale in FIG. 9. In a practical embodiment, there can be many hundreds of burls distributed across a substrate holder of diameter, e.g., 200 mm, 300 mm or 450 mm. The tips of the burls have a small area, e.g. less than 1 mm², so that the total area of all of the burls on one side of the substrate holder 100 is less than about 10% of the total area of the total surface area of the substrate holder. Because of the burl arrangement on the support, there is a high probability that any particle that might lie on the surface of the substrate, substrate holder or substrate table will fall between burls and will not therefore result in a deformation of the substrate or substrate holder. The burl arrangement, which may form a pattern, can be regular or can vary as desired to provide appropriate distribution of force on the substrate and substrate table. The burls can have any shape in plan but are commonly circular in plan. The burls can have the same shape and dimensions throughout their height but are commonly tapered. The projections can project a distance of from about 1 μm to about 5 mm, desirably from about 5 μm to about 250 μm, from the rest of the surface of the main body 100a of the substrate holder 100. The thickness of the main body 100a of the substrate holder 100 can be in the range of about 1 mm to about 50 mm, desirably in the range of about 5 mm to 20 mm, typically 10 mm.

In an embodiment of the invention, the substrate holder 100 is made of rigid material. Desirably the material has a high thermal conductivity or a low coefficient of thermal expansion. A suitable material includes SiC (silicon carbide), SiSiC (siliconised silicon carbide), Si₃N₄ (silicon nitride), quartz, and/or various other ceramic and glass-ceramics, such as Zerodur™ glass ceramic. The substrate holder 100 can be manufactured by selectively removing material from a solid disc of the relevant material so as to leave the projecting burls. A suitable technique to remove material includes electrical discharge machining (EDM), etching, machining and/or laser ablation. Some of these techniques leave a rough surface, e.g. having a roughness value Ra of the order of several microns. The minimum roughness achievable with these removal techniques may derive from the material properties and burl manufacturing process. For example, in the case of a two-phase material such as SiSiC, the minimum roughness achievable is determined by the grain size of the two-phase material. The substrate holder can also be manufactured by growing burls through a mask. The burls are of the same material as the base and can be grown by a physical vapor deposition process or sputtering.

Such residual roughness causes difficulty in forming one or more electrical components, such as one or more thin film components, on the surface of the substrate and unreliability in such components. These problems may arise because the roughness causes gaps and cracks in thin layers coated or grown on the substrate holder to form an electronic component. A thin film component may have a layer thickness in the range of from about 2 nm to about 100 μm and may be formed by a process including chemical vapor deposition, physical vapor deposition (e.g. sputtering), dip coating, spin coating and/or spray coating. In an embodiment, a component formed on the substrate holder comprises a thin film stack, i.e. including a plurality of thin film layers. Such components are described further below.

An arrangement may be provided in which a substrate holder for a lithographic apparatus has a planarization layer provided on a surface thereof. The planarization layer provides a smooth surface for formation of a thin film stack. Such an arrangement is disclosed in US 2012-0212725 A1, which document is incorporated herein by reference in its entirety.

An electronic component to be formed on the substrate table can include, for example, an electrode, a resistive heater and/or a sensor, such (in a non-limiting list) as a strain sensor, a magnetic sensor, a pressure sensor, a capacitive sensor or a temperature sensor. A heater and sensor, for example when included in an electrical system or circuit, can be used to locally control and/or monitor the temperature of the substrate holder and/or substrate so as to reduce undesired or induced desired temperature variation and stress in the substrate holder or substrate. Desirably, the heater and sensor are located on, around and/over the same region as each other. It is desirable to control temperature and/or stress of the substrate in order to reduce or eliminate imaging errors such as overlay errors due to local expansion or contraction of the substrate. For example, in an immersion lithography apparatus, evaporation of residual immersion liquid (e.g., water) on the substrate may cause localized cooling, may apply a heat load to the surface on which the liquid is located and hence shrinkage of the substrate. Conversely, the energy delivered to the substrate by the projection beam during exposure can cause significant heating, apply a heat load to the substrate and therefore expansion of the substrate.

In an embodiment, the component to be formed is an electrode for an electrostatic clamp.

In an embodiment, one or more localized heaters 101 are controlled by controller 103 to provide a desired amount of heat to the substrate holder 100 and substrate W to control the temperature of the substrate W. One or more temperature sensors 102 are connected to controller 104 which monitors the temperature of the substrate holder 100 and/or substrate W. In an embodiment, a potential difference is generated between electrodes in order to provide an electrostatic clamping force between the substrate W and the substrate holder 100 and/or between the substrate holder 100 and the substrate table WT. In an embodiment, the heaters 101 are used as the electrodes and the controller 103 is configured to apply the potential difference. In other embodiments, a separate potential difference source may be provided and/or separate electrodes may be provided. In an embodiment, the electrodes 101 are encapsulated between electrical isolation layers. In an embodiment, a potential difference of the order of 10 to 5,000 volts is generated between the electrodes 101.

Arrangements using one or more heaters and temperature sensors to locally control the temperature of a substrate are described in U.S. publication no. 2011-0222033, which document is incorporated herein by reference in its entirety. The arrangements described therein can be modified to make use of a resistive heater and temperature sensor as described herein.

The electrical devices may be on a top surface of the substrate holder 100. At least part of the electrical connection may pass through the body of the substrate support 100 as described in US publication no. 2012-0274920, which is hereby incorporated by reference in its entirety.

In the description above referring to FIG. 9, reference is made to an embodiment including a substrate holder 100 mounted on a substrate table WT. However, the description is equally applicable to equivalent embodiments in which a patterning device holder 100 is provided in place of the substrate holder 100 and a support structure MA for a patterning device is provided in place of the substrate table WT. Furthermore, the description is equally applicable to any object holder for supporting an object for use in a lithographic apparatus.

As explained in the introductory part of the description, an isolation layer may be provided between the substrate holder and the substrate or between a patterning device and a patterning device holder to prevent electrical breakdown during electrostatic clamping. Imperfections in the isolation layer can reduce performance of the electrostatic clamp by requiring higher operating voltages, by introducing spatial variations in the clamping force, or by reducing durability. Variations in the distance between heaters or sensors formed on the substrate holder 100 and the substrate can reduce the accuracy of temperature control of the substrate. FIGS. 10-24 illustrate methods and apparatus for addressing one or more of these problems.

FIGS. 10-16 illustrate a method for manufacturing an object holder 100 (e.g. a substrate or patterning device holder) which facilitates accurate positioning of a layered structure comprising one or more layers on the object holder 100 relative to the object being held (e.g. a substrate W). Alternatively or additionally, the disclosed method facilitates formation of the layered structure with a low level of imperfections.

Figure 10:
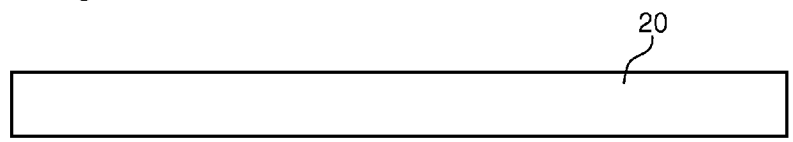
FIG. 10 depicts a carrier sheet for use in manufacturing a substrate or patterning device holder.

FIG. 10 depicts a carrier sheet 20 for use in the manufacturing process. In an embodiment, the carrier sheet comprises a silicon wafer.

Figure 11:
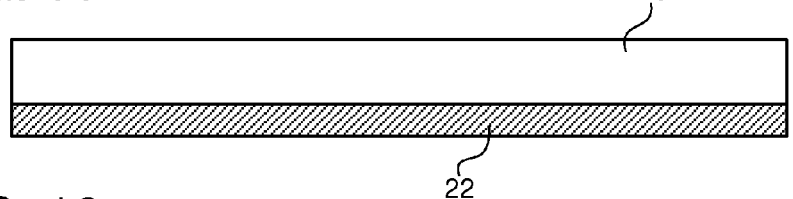
FIG. 11 depicts a composite structure created by forming a first layer on the carrier sheet of FIG. 10.

FIG. 11 depicts the carrier sheet 20 after formation of a first layer 22 of the layered structure on the carrier sheet 20. The first layer 22 may be the only layer of the layered structure or one or more further layers may be provided on the first layer 22 (see FIG. 17 for example). The combination of carrier sheet 20 and layered structure (e.g. first layer 22 and optionally one or more further layers) may be referred to as a "composite structure". In an embodiment, the first layer 22 is formed by oxidizing the carrier sheet 20. The oxidation process may be performed at high temperature, for example at 1000 degrees C. In an embodiment the carrier sheet 20 comprises a silicon wafer and the first layer 22 comprises thermal $SiO_2$. Thermal $SiO_2$ is silicon oxide that has been produced by thermal oxidation of a silicon wafer rather than, for example, by a deposition process. In an embodiment the thickness of the thermal $SiO_2$ is between about 0.5 micron and about 2 micron.

Figure 12:
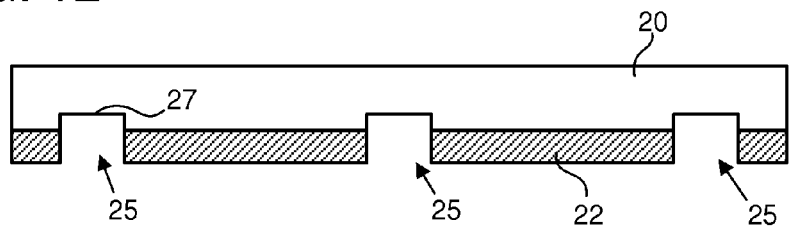
FIG. 12 depicts the composite structure of FIG. 11 after formation of indentations through the first layer and into the carrier sheet.

FIG. 12 depicts the composite structure of FIG. 11 after formation of indentations 25. The indentations 25 each have a base 27 defining the deepest part of the indentation 25. The indentations 25 penetrate through the layered structure (in this case the first layer 22) and into the carrier sheet 20. The depth to which the indentations 25 penetrate into the carrier sheet 20 determines the amount by which the projections 106 will protrude beyond the first layer 22 in the completed substrate or patterning device holder (see FIGS. 15 and 16 for example). In an embodiment, the projections 106 extend integrally out of the main body 100a of the object holder (rather than being grown or deposited on the main body 100a).

In an embodiment, the indentations 25 are formed using one or more of the following processes: reactive ion etching, reactive ion etching using a mask, reactive ion etching using a hard mask, deep reactive ion etching, exposure of one or more photosensitive layers (which may be provided as part of the first layer 22 or as part of one or more further layers that might be attached to the first layer 22).

Figure 13:
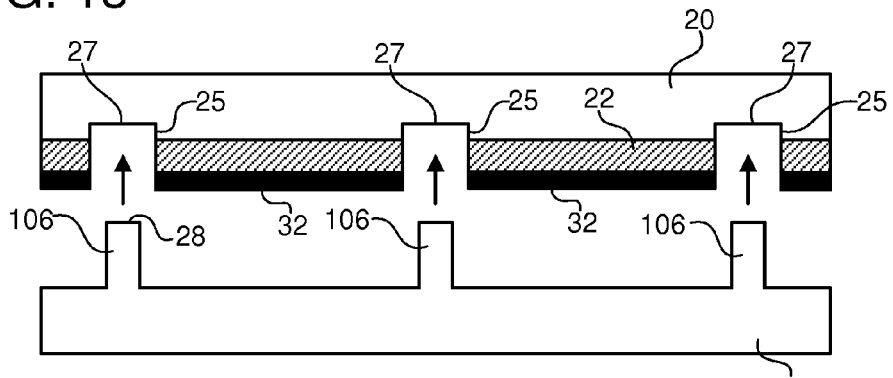
FIG. 13 depicts a process of attachment of a substrate or patterning device holder main body to the composite structure of FIG. 12, with projections on the main body engaging with the indentations in the composite structure.

FIG. 13 depicts attachment of a main body 100a to the composite structure with indentations shown in FIG. 12. An adhesive layer 32 is provided for attaching the main body 100a to the composite structure. In an embodiment the adhesive layer 32 comprises one or more of the following: epoxy, acrylate or benzocyclobutene-based polymer. In an embodiment the adhesive layer 32 is applied by dispensing, jetting or roller coating to one or both of the surfaces to be connected together. In the embodiment shown the adhesive layer 32 is applied only to the surface of the composite structure in between the indentations 25. In an alternative embodiment, the adhesive layer 32 is applied to the main body 100a in the region between the projections 106, or to both the main body 100a and the composite structure. The surface on which the adhesive layer 32 is applied may be surface treated before application to ensure good adhesion. The attachment may be achieved by pressing or holding together the composite structure against the main body 100a and/or, where provided, against projections 106 of the main body 100a. The temperature may be raised above room temperature to cure the adhesive layer 32. For example, where the adhesive layer 32 comprises a benzocyclobutene-based polymer (BCB), the temperature may be raised above 250 degrees C. Above 150 degrees C. the BCB becomes very liquid and cross-links above 250 degrees C. After cross-linking the composite structure is fixed to the main body 100a. The bonding is optionally performed in a vacuum environment to avoid or reduce air bubble entrapment.

The main body 100a is attached such that the indentations 25 in the composite structure engage with the projections 106 from the main body 100a. The engagement is made possible by arranging for the indentations 25 to spatially complement the projections 106. In an embodiment, the indentations 25 are positioned and shaped so as each to receive one or more of the plurality projections 106. In an embodiment, all of the plurality of projections 106 are received in corresponding indentations 25. End surfaces 28 of the projections 106 are brought into contact with the carrier sheet 20 in the indentations 25 (for example by touching the bases 27 of the indentations 25). In an embodiment, the bases 27 of the indentations are all provided at the same level (e.g. in the same plane). In an embodiment, the end surfaces 28 of the projections 106 touch the material of the carrier sheet 20 directly. In an alternative embodiment a protective layer is provided on each end surface 28. In such an embodiment each end surface 28 is brought into contact with the carrier sheet 20 via the protective layer. In an embodiment, the protective layer acts as a stop point for an etching process for removing the carrier sheet 20. The protective layer may therefore prevent removal or damage of the projections 106 during the etching process. The protective layer may be removed in a separate step after removal of the carrier sheet 20, for example using an etch that is specific for the projective layer but which does not damage the main body 100a or projections 106. Bringing the end surfaces 28 of the projections into contact with the carrier sheet directly (or indirectly via a thin layer and/or a layer whose thickness is controlled accurately) facilitates accurate control of the distance between the end surfaces 28 of the projections 106 (and therefore any object that is mounted on the projections 106 in use) and the upper surface of the first layer 22.

In an alternative embodiment the projections 106 are made shorter than the depth of the indentations 25. This arrangement results in the gap between the main body 100a and the carrier sheet 20 being very small after bonding. Achieving a small gap may be desirable in the case that the main body 100a is non-conductive and/or has a smooth surface.

Figure 14:
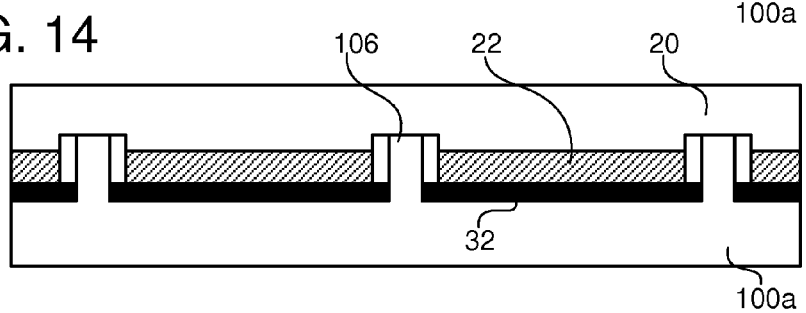
FIG. 14 depicts the substrate or patterning device holder main body attached to the composite structure after completion of the process of FIG. 13.

FIG. 14 depicts the main body 100a attached to the composite structure via the adhesive layer 32.

Figure 15:
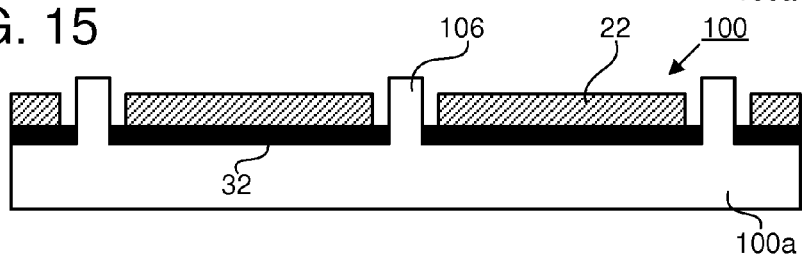
FIG. 15 depicts a substrate or patterning device holder formed by removal of the carrier sheet from the arrangement of FIG. 14.

FIG. 15 depicts the object holder 100 formed by removal of the carrier sheet 20 from the composite structure in the arrangement of FIG. 14. The removal of the carrier sheet 20 leaves the layered structure (consisting of the first layer 22 in the example shown) attached to the main body 100a with the projections 106 protruding beyond the layered structure and thereby available to support an object (e.g. substrate W).

In an embodiment, the carrier sheet 20 is removed by back grinding or polishing and/or wet or dry etching. For example, backgrinding or polishing may be performed for most of the removal process with the final about 100 microns being removed by a dry etch). The first layer 22 acts as a stopping layer for the etch (i.e. the etch is effective for removing the material of the carrier sheet 20 but has no or minimal effect on the first layer 22). This approach is suitable where the carrier sheet 20 comprises a silicon wafer for example.

In an alternative embodiment, the first layer 22 comprises an organic film, e.g. polyimide. Removing of the carrier sheet 20 is achieved by laser exposing the organic film which causes the organic film to decompose. The decomposition produces gases that cause the carrier sheet to release from the composite structure. The carrier sheet 20 of such an embodiment may comprise a glass for example. This approach has certain drawbacks in comparison with embodiments in which the first layer comprises silicon oxide and the carrier sheet is removed by etching. One drawback is that the maximum processing temperature for forming additional layers on the carrier sheet is limited by the presence of the organic film. Most organic films are damaged at high temperatures. Typically, the presence of the organic film limits processing to temperatures up to a maximum of about 300-400 degrees C. If the first layer is silicon oxide, the maximum processing temperature will be limited only by the nature of the additional layers to be formed.

US 2007-0210313 A1 discloses a method for fabricating a thin film transistor including a polycrystalline silicon layer formed by irradiating an amorphous silicon layer with a laser through an organic layer formed on the amorphous silicon layer and removing the organic layer, and is incorporated herein by reference in its entirety. US 2011-0227086 discloses a further method of manufacturing that uses a laser release process and is incorporated herein by reference in its entirety.

Figure 16:
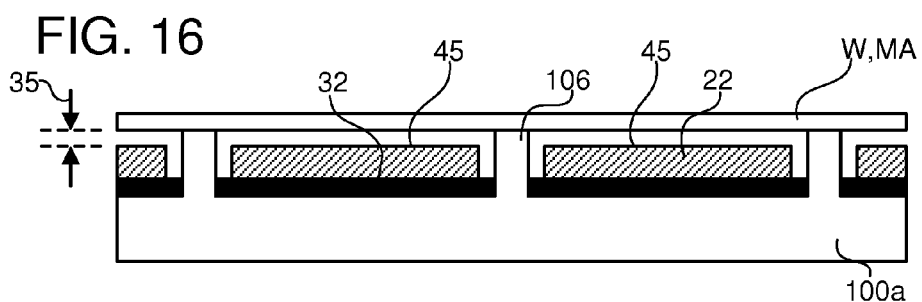
FIG. 16 depicts a substrate or patterning device mounted on the substrate or patterning device holder of FIG. 15.

FIG. 16 depicts the object holder 100 of FIG. 15 supporting an object (e.g. a substrate W or a patterning device MA).

The separation 35 between the object and the outer surface 45 of the first layer 22 is defined by the depth to which the indentations 25 extended into the carrier sheet 20. In an embodiment, the depth is about 10 microns. The depth can be controlled with great accuracy and uniformity, thus ensuring that the separation 35 is controlled precisely and that a high level of parallelism is achieved. Where the carrier sheet 20 comprises a silicon wafer, for example, the etching can typically be achieved with a depth deviation of less than 5% over the wafer.

Forming the first layer 22 on a carrier sheet 20 that is different to the main body 100a of the object holder 100 facilitates accurate formation of the first layer 22. For example, the thickness of the first layer 22 can be controlled with greater precision and/or with greater uniformity (e.g. more parallel to the carrier sheet 20 and therefore to the main body 100a after attachment) than can typically be achieved by depositing a similar layer directly onto the main body 100a. For example, the presence of the projections 106 can inhibit accurate deposition directly onto the main body 100a. Where the first layer 22 is formed by oxidation of the carrier sheet 20, improved accuracy may be achieved due to the advantages of oxide growth relative to deposition-based alternatives. As discussed in the introductory part of the description, for example, deposition techniques tend to introduce imperfections in the deposited layer, such as pinhole imperfections, stresses and cracks. A layer formed by oxidation can have lower levels of such imperfections.

In the case where the first layer 22 is a thermal $SiO_2$ formed by thermal oxidation of a silicon wafer, for example, various improvements relative to a silicon oxide layer formed by deposition are observed. Pinhole imperfections are reduced or avoided in the thermal $SiO_2$ layer. Oxygen content is more uniform in the thermal $SiO_2$ layer. There is a reduced variation in the oxygen content with depth, for example. The oxygen content in the thermal $SiO_2$ layer is generally lower than the oxygen content in a deposited layer. Instead of a range of different oxidation states, the oxidation state in the thermal $SiO_2$ layer is predominantly constant reflecting the presence of only one type of oxide and saturated bonding ($SiO_2$). Density is higher and more uniform in the thermal $SiO_2$ layer, resulting in lower internal stresses, reduced cracking and higher strength. The strength also tends to be more uniform in the thermal $SiO_2$ layer. The thermal $SiO_2$ layer is therefore generally stronger and more mechanically reliable, leading to greater durability and/or longer life. The voltage breakdown strength is significantly increased in the thermal $SiO_2$ layer relative to a deposited layer. Detection of one or more of the above properties may be used easily to detect whether a given layer is a thermal $SiO_2$ layer or a silicon oxide layer formed by a different process (such as by deposition). For example, apparatus for testing the strength of the layer and/or comparing the strength of the layer with the strength of a known thermal $SiO_2$ layer or a known deposited silicon oxide layer may be used. For example, apparatus for applying a potential difference across the layer and monitoring for electrical breakdown (for example by measuring the resistivity of the layer) may be used to determine the voltage breakdown strength.

The voltage breakdown strength of a thermal $SiO_2$ layer is significantly higher than a deposited silicon oxide layer. Typically, the thermal $SiO_2$ layer has a voltage breakdown strength that exceeds 1000 V/micron, which is much higher than a deposited silicon oxide layer. This higher voltage breakdown strength makes it possible to provide a very thin isolation layer for electrostatic clamps, thereby reducing the required operational voltage to about 1 kV. For isolation layers formed by depositing silicon oxide the operational voltage typically needs to be about 3 kV. Embodiments are therefore provided in which the layered structure comprises a thermal $SiO_2$ layer that is configured to act as an electrical isolation layer, for example in an object holder comprising an electrostatic clamp.

Figure 17:
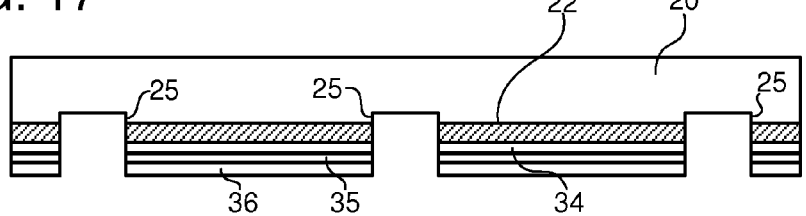
FIG. 17 depicts a carrier sheet with a first layer and a stack of one or more further layers formed on the first layer.
Figure 18:
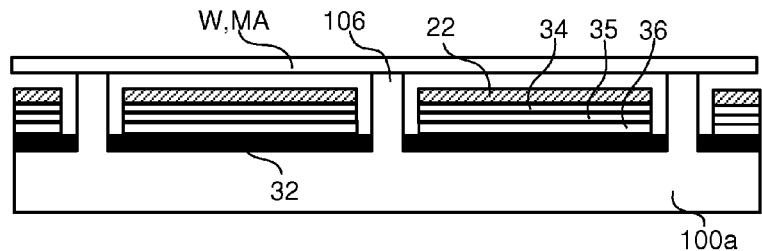
FIG. 18 depicts a substrate or patterning device holder formed using the carrier sheet of FIG. 17.

In the embodiment described with reference to FIGS. 10-16, the layered structure comprises only a single layer 22 on the carrier sheet 20 prior to connection to the main body 100a. This may be appropriate for example where the layer 22 is to be used as an isolation layer for an electrostatic clamp in the case where the electrode for the electrostatic clamp does not need to be provided in between the layer and the main body 100a (for example because the electrode is provided within the main body 100a itself). In an example of such an embodiment, the single layer 22 is formed from a thermal $SiO_2$ layer, which is, as discussed above, particularly effective as an isolation layer. In other embodiments, the layered structure may comprise a stack of one or more further layers, which are formed on the carrier sheet 20 prior to attachment of the composite structure to the main body 100a. FIG. 17 depicts one such embodiment, where the stack comprises first 34, second 35 and third 36 further layers. After formation of the stack of one or more further layers, the composite structure may be processed according to the method steps discussed above with reference to FIGS. 12-16. A plurality of indentations 25 may be formed for example through the stack 34-36 and the first layer 22 (i.e. through the whole layered structure) into the carrier sheet 20. The composite structure may then be attached to the main body 100a via an adhesive layer 32 and the carrier sheet 20 removed to expose the projections 106 and the first layer 22. An object (e.g. a substrate W or a patterning device MA) can then be mounted on the projections 106, as shown in FIG. 18.

In an embodiment, the layered structure comprises one or more electrically functional components (e.g. in the stack 34-36). For example, the layered structure may comprise a heater, a sensor, or an electrode for an electrostatic clamp. The sensor may be temperature sensor for use in conjunction with one or more resistive heaters for controlling the temperature of the substrate W for example.

Forming electrically functional components on the carrier sheet 20 makes it possible to test the components prior to attachment of the components to the main body 100a of the object holder 100. Reductions in yield due to unexpected performance after the transfer of the components to the main body 100a of the object holder 100 can thereby be reduced.

In an embodiment, the first further layer 34 of the stack comprises metal conduction paths, e.g. lines. The first further layer 34 may therefore not be a continuous, slab-like (e.g. planar) layer. The lines may be formed by metal deposition followed by photolithography and etching or by photolithography followed by metal deposition or lift off. Metal lines desirably have a width greater than 20 μm. The maximum width of the metal lines is determined by their function and available space; it can be several 10s of millimeters. Other methods of forming the metal lines are usable. In the case of a heater and/or sensor, wide metal lines (e.g. about 1500 μm) can be used as heating elements and narrow metal lines (e.g. about 100 μm) can be used as sensor elements. For the electrodes of an electrostatic clamp, two halves of continuous metal film (but isolated from the end surfaces 28 of the projections 106) separated by approximately 500 μm from each other can be deposited to form positive and negative elements of the electrostatic clamp. Metal lines desirably have a layer thickness greater than about 20 nm, desirably greater than about 40 nm. Metal lines desirably have a layer thickness less than or equal to about 1 μm, desirably less than about 500 nm, desirably less than about 200 nm. The first layer 22 may act as an electrical isolation layer.

For heater and/or sensor development, patterned metal lines may consist of multiple metal layers of for example titanium (Ti) and platinum (Pt), Ti—Pt. In an embodiment, the line has one or more layers of titanium with a cumulative thickness of 10 nm for improved adhesion of approximately 250 nm thick platinum present in one or more thin film layers. Each metal line may have varying width. Patterning of the metals, e.g. Ti/Pt, may be achieved using a combination of one or more photo resist deposition steps, PVD for metal film deposition and a lift off process (whereby for example photoresist is removed from regions where the photoresist is present, the removal of photoresist causing any metal present on the photoresist to be lifted off and also removed). For a heater alone, wide chromium (Cr) lines (~1500 μm) can be deposited by Cr film deposition (PVD). The pattern of the heater may be formed by selective Cr etching using a photolithographic mask. A metal electrode of an electrostatic clamp may consist of aluminum, or chromium or any other conductive material. The metal electrode may be formed by PVD or sputtering. Alloys of these metals in any suitable combination may be used.

The first layer 22 may be configured to act as an electrical isolation layer, isolating for example deposited metal lines in the first further layer 34 from above. Alternatively or additionally, the first layer 22 may be configured to protect the metal lines from particle depositions, scratches and oxidation. The second further layer 35 may be provided to isolate the first further layer 34 from the main body 100a. For a heater or a sensor, the second further layer 35 can be deposited by spray coating of BCB (Dow Chemical) and/or NN 120 (Dupont) or $SiO_x$ or a combination of sprayed layers and $SiO_x$. A third further layer 36 may act as a spacer layer.

In an embodiment, the second further layer 35 comprises a layer of SiOx deposited using CVD. The thickness of the second further layer 35 may be between about 0.5 micron and 10 micron for example. In an embodiment the third further layer 36 comprises polyimide. The third further layer 36 may be between about 5 and 50 micron thick. In this embodiment the indentations 25 are formed through the layers 34-36 and into the carrier sheet 20 as follows. The third further (polyimide) layer 36 is patterned by reactive ion etching using a hard mask. In an alternative embodiment a photosensitive polyimide is used and patterned accordingly. Subsequently, the second further (SiOx) layer 35 underneath the layer 36 and the first layer 22 are etched, optionally by reactive ion etching. Typically, the first further layer 34 which defines the electrically functional components is not a continuous layer and is not present where the indentations 25 are to be formed. In a final step, the indentations 25 are extended into the carrier sheet 20 (which may be silicon wafer) using deep reactive ion etching. The situation after such processing is shown in FIG. 17.

In an embodiment, the adhesive layer 32 is omitted in a selected region to allow the first layer 22 and any further layers 34-36 formed thereon to be flexed relative to the main body 100a in the selected region. An example of such an embodiment is shown in FIGS. 19 and 20.

Figure 19:
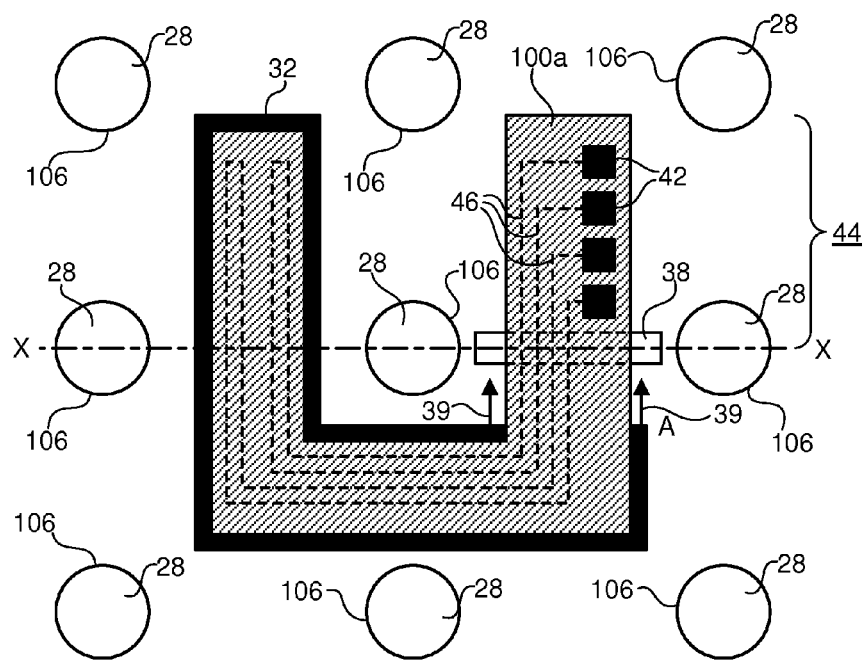
FIG. 19 is a top view of an arrangement in which the first layer and one or more further layers can be flexed and passed through a hole in the substrate or patterning device holder to allow electrical connections to be made on the side of the substrate or patterning device holder opposite to the substrate or patterning device.
Figure 20:
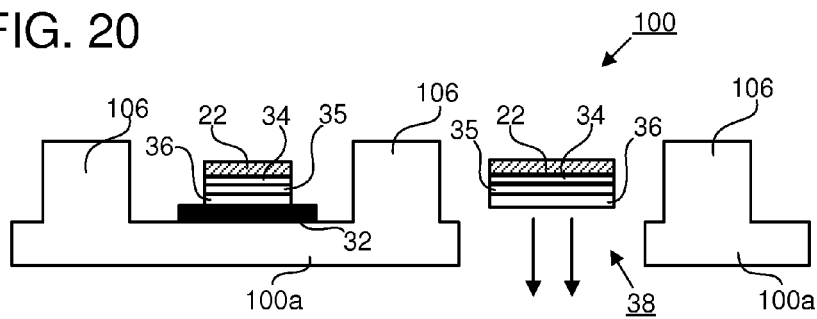
FIG. 20 is a side sectional view along line X-X of the arrangement of FIG. 19.

FIG. 19 is a top view of an object holder 100 looking down on end surfaces 28 of projections 106 according to an example embodiment. FIG. 20 is a side sectional view along line X-X. An example circuit pattern comprising conductor lines 46 and contact pads 42 is formed in further layer 34 and shown in broken lines in FIG. 19. In the particular example shown the conductor lines 46 are covered by the first layer 22 and the contact pads 42 are exposed (not covered by the first layer 22). The adhesive layer 32 is omitted from a selected region underneath the first layer 22 and further layers 34-36 on the right side of the arrangement from point A upwards, as indicated by arrows 39. The omission of the adhesive layer allows the first layer 22 and further layers to be flexed in the selected region. A through-hole 38 is provided in the main body 100a that allows the first layer 22 and further layers 34-36 to be fed through from the object side of the object holder 100 (the side shown in FIG. 19, often referred to as the upper side of the object holder 100) to the opposite (or lower) side. In the particular example shown the portion of the first layer 22 and further layers 34-36 above the line X-X on the right hand side of the figure, corresponding the length marked 44 on the figure, can be fed into the through-hole 38. This arrangement allows electrical connections to be made easily to the exposed contact pads 42 from the underside of the object holder 100. Making connections from the underside of the object holder 100 may be convenient because of the limited space and/or access from above it many situations (e.g. where the object holder is a substrate holder). The use of flexible layers improves reliability, for example in comparison with making contacts with rigid contact pads directly through a hole in the object holder (e.g. substrate holder), where the contact pads are typically too fragile to achieve reliability. Making contact with flexible layers is also generally easier than making contact with rigid contact pads, thus making the contacts easier to realize. Making the contacts easier to realize is particularly important in situations where many contacts have to be made. An example situation where many contacts have to be made is where the contacts are associated with sensing or driving electronics.

In an embodiment, the flexible layers may behave like a thin type of flexible substrate, e.g. a polyimide flexible foil. This can be connected to in a variety of standard ways. For example, the flexible substrate may be connected to a stiffener board and/or contacts made using: 1) solder, 2) a clamping connector (e.g. zif connector), 3) a wire bond; and/or 4) a conductive adhesive.

In the examples discussed above, the process of connecting a first layer 22 on a carrier sheet 20 to the main body 100a of an object holder (e.g. substrate holder) 100 is performed in the context of a main body 100a of an object holder having projections 106 extending integrally out of the main body 100a. In alternative embodiments the process is performed in the context of an object holder that does not comprise such projections. An example process is illustrated in FIGS. 21-23.

Figure 21:
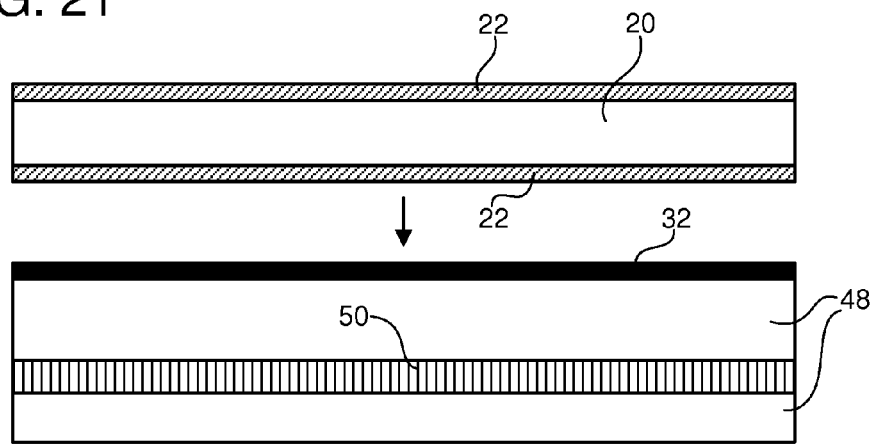
FIG. 21 depicts connection of an oxidized silicon wafer to a substrate or patterning device holder without projections that comprises an electrode for an electrostatic clamp.

FIG. 21 depicts connection of a composite structure 20, 22 to an object holder (e.g. substrate holder or patterning device holder) main body 48 that does not comprise integral projections. The main body 48 may comprise MN for example. In the example shown the main body 48 is substantially flat on an upper surface. The composite structure comprises a carrier sheet 20 with first layers 22 on upper and lower sides. In this example the first layers 22 have been formed by oxidation of the carrier sheet 20 (e.g. to form thermal $SiO_2$ in the case where the carrier sheet is a silicon wafer). The first layer 22 that is formed on the upper side of the carrier sheet 20 is not used in this particular embodiment but it may be easier to oxidize both sides of the carrier sheet 20 rather than just a single side. In other embodiments, only the lower side of the carrier sheet 20 is oxidized. The main body 48 comprises an adhesive layer 32 on an upper surface.

In this example the main body 48 further comprises an electrode layer 50 baked into the main body 48. The electrode layer 50 comprises an electrode for use in an electrostatic clamp for clamping an object against the object holder. FIG. 22 depicts the composite structure 20, 22 and main body 48 connected together via the adhesive layer 32. FIG. 23 illustrates an object holder formed by removing the carrier sheet 20 (and upper first layer 22) to leave the first layer 22 on the adhesive layer 32 and, subsequently, forming projections 52 on top of the first layer 22. The projections 52 may be configured to support an object on the object holder for example. In an embodiment the projections 52 comprise SiC.

Figure 22:
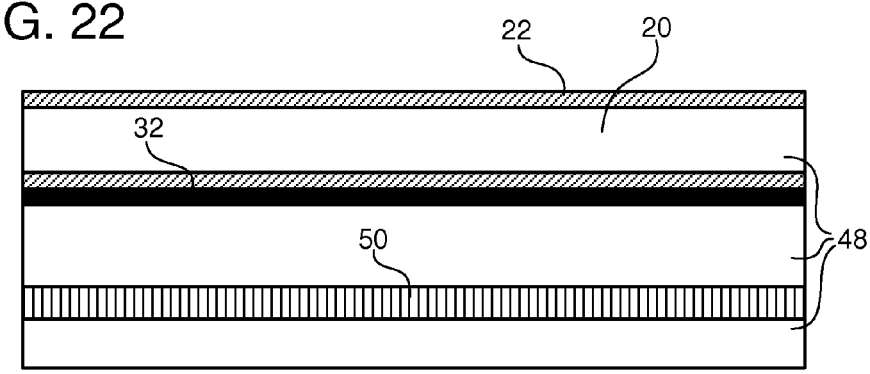
FIG. 22 depicts the wafer and holder of FIG. 21 after connection.
Figure 23:
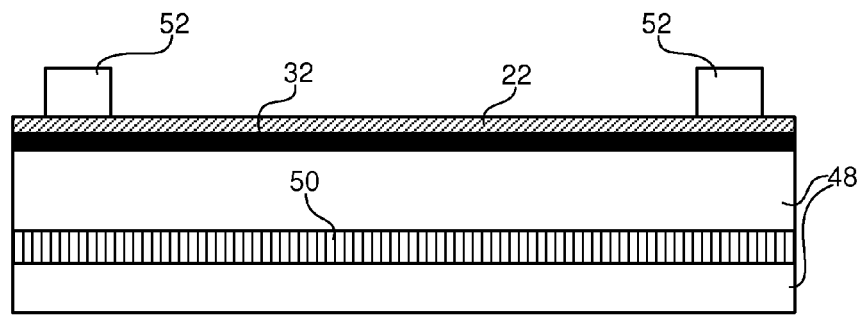
FIG. 23 depicts a substrate or patterning device holder formed by removal of the silicon wafer from the arrangement of FIG. 22 and the addition of projections.
Figure 24:
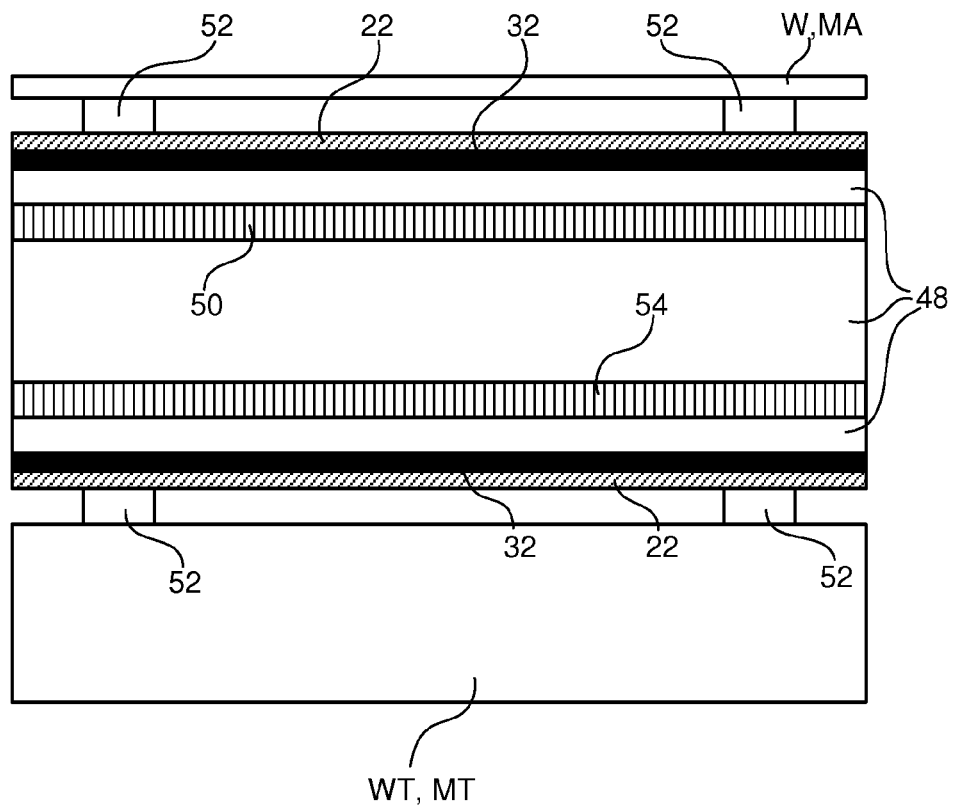
FIG. 24 depicts a substrate or patterning device holder having thermal $SiO_2$ layers on a surface between the substrate or patterning device holder and the substrate or patterning device and on a surface between the substrate or patterning device holder and the substrate table or support structure for the patterning device.

FIG. 24 illustrates a further example embodiment in which first layers 22 are formed on upper and lower sides of an object holder main body 48 using the process of FIGS. 21-23 repeated on upper and lower sides of the holder. Two carrier sheets 20 are used, one to attach the first layer 22 to the upper surface of the main body 48 and one to attach the first layer 22 to the bottom surface. In this example two electrode layers 50 and 54 are provided. Electrode layer 50 is configured to electrostatically clamp the object W to the object holder and electrode layer 54 is configured to electrostatically clamp the object holder to a supporting structure for the object holder, which may be referred to as an object table. The object table may be a substrate table WT for supporting a substrate holder, for example. The object table may be a supporting structure MT for supporting a patterning device holder, for example.

In any of the above-described methods, the steps for forming layered structures on the object holder may be repeated as required to form multiple layered structures. For example an object holder may be provided that comprises projections of different heights in cross-section that are formed by combinations of multiple different layered structures. The projections of different heights may for example form different features such as ridges (in plan view) or act as spacers. The different layered structures may comprise different electrically functional components (e.g. circuitry), which may have different uses. In an embodiment, the highest of the projections may be used as burls to support an object (e.g. substrate) on the object holder.

As described above in the introductory part of the description, it is known to provide a grounding layer in electrical contact with projections (burls) for holding an object such as a substrate or patterning device. In known arrangements this has been done by depositing a relatively thick layer of CrN. The deposited layer is then patterned to form the grounding layer. The pattern may comprise a series of lines that connect together distal ends of the projections. Such patterns are sometimes referred to as "Manhatten" patterns. The roughness of the CrN may be increased to avoid sticking of the object to the projections. This may be achieved for example using an ion beam figuring wet etching process.

Figure 25:
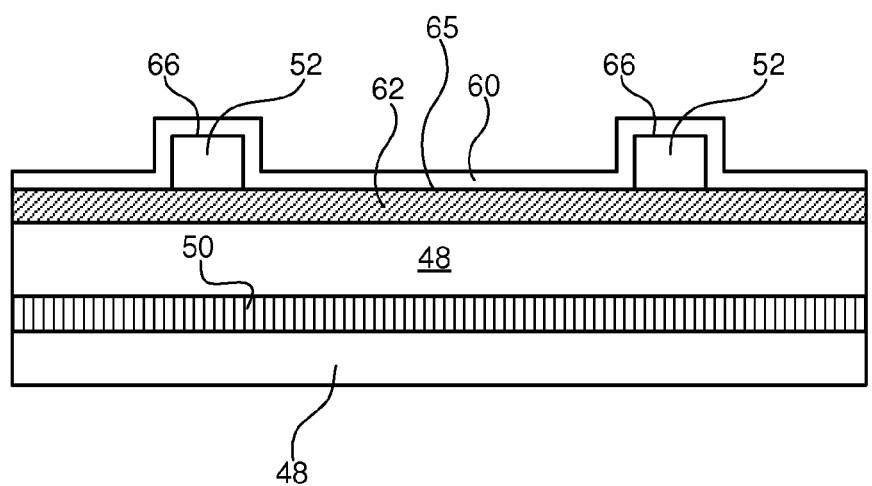
FIG. 25 depicts a substrate or patterning device holder having a grounding layer formed over upper surfaces of projections.

FIG. 25 depicts an example arrangement of this type. An object holder is provided that comprises a plurality of projections 52 protruding from a base surface 65 of the object holder, each projection 52 having a proximal end at the base surface 65 and a distal end 66. The distal end 66 is the end furthest from the base surface 65. An electrode 50 is provided that electrostatically clamps an object (e.g. a substrate or patterning device) to be supported by the object holder against the projections 52. The object is held in contact with the distal ends 66 of the projections 52. Alternatively or additionally, an electrode may be provided to electrostatically clamp the object holder to an object table (e.g. a substrate table or support structure for a patterning device) that is adapted to support the object holder. The object table is held in contact with the distal ends 66 of the projections 52. A grounding layer 60 is provided that electrically connects two or more of the projections 52 (optionally all of the projections) to ground or a common electrical potential. A dielectric layer 62 may be provided underneath the projections 52 on a main body 48. In the arrangement of FIG. 25, the grounding layer 60 is provided on distal ends 66 of the projections 52 and on the dielectric layer 62. As described above, the grounding layer 60 may be patterned so as to connect together the distal ends 66, for example in a "Manhatten" pattern of lines.

In the arrangement of FIG. 25, the grounding layer 60 covering the distal ends of the projections 52 will be brought into direct contact in use with an object being supported by the object holder or an object table that is supporting the object holder. The grounding layer 60 therefore has to be resistant to wear caused by "cycling" of the objects (i.e. repetitive sequences of object manipulation) using the object holder. The grounding layer 60 may also need to be resistant to wear caused by other processes that act directly on the distal ends 66 of the projections 52. For example cleaning operations may act on the distal ends 66, using abrasion and/or chemicals. The grounding layer 60 may also have to be compatible with roughening treatments to prevent sticking of the object or object table to the distal ends 66. For example, where an ion beam figuring wet etching process is used, the grounding layer 60 will need to be compatible with this process. These requirements limit the range of materials that can be used for the grounding layer 60. This may lead to the material being sub-optimal. The grounding layer 60 may also need to be sufficiently thick to accommodate a roughening treatment and/or to allow for tuning of flatness (e.g. to adjust the projections 52 so that the distal ends 66 all lie in the same plane). Larger thicknesses may increase the chances of delamination (detachment of the grounding layer) and/or complicate manufacture of the grounding layer.

Figure 26:
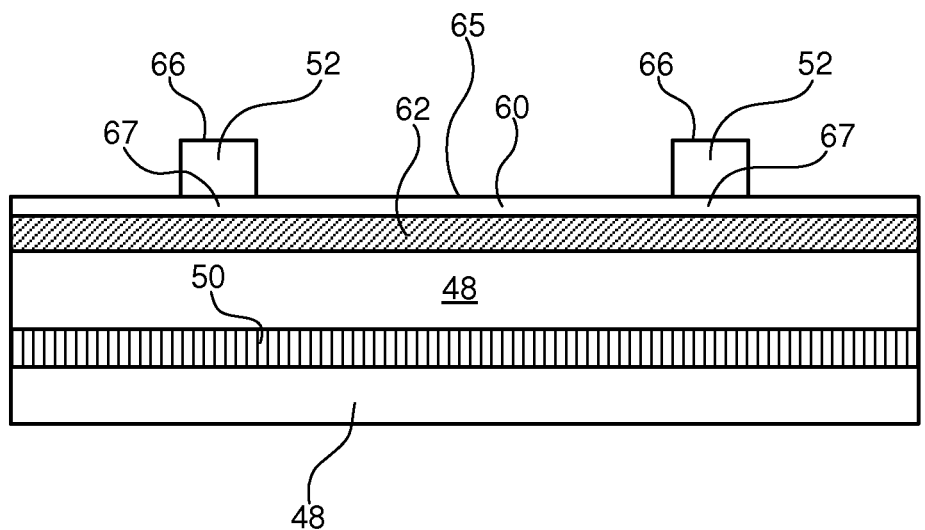
FIG. 26 depicts a substrate or patterning device holder having a grounding layer formed in between a dielectric layer and the projections.
Figure 27:
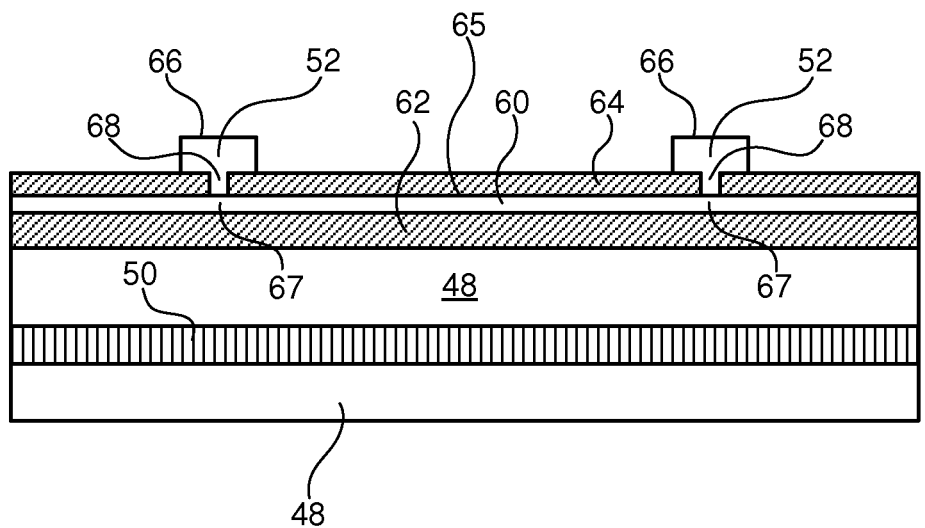
FIG. 27 depicts a substrate or patterning device holder having a grounding layer formed in between a dielectric layer and the projections with a protective layer formed over portions of the grounding layer.

In an embodiment, one or more of the above problems are addressed by forming the grounding layer 60 in such a way that the grounding layer 60 comprises a portion 67 that is in between the dielectric layer 62 and at least one of the plurality of projections 52 that is/are connected to ground or the common electrical potential by the grounding layer 60. Examples of such arrangements are shown in FIGS. 26 and 27. In this way, electrical contact can be made to the projections 52 from below rather than above. In this or any embodiment the projections 52 are preferably formed from a material having high electrical conductivity, for example a metallic material, so as to maintain an equal potential over the height of the projection 52. In this way, the electrical contact between the grounding layer 60 and the lower part of the projection 52 is effective also to ground the distal end 66 of the projection 52. There is therefore no longer any need to provide any grounding layer 60 on the distal ends 66 of the projections. If the grounding layer 60 is not present on the distal ends 66, then it is no longer necessary to provide the same level of wear resistance as that required for an arrangement such as that of FIG. 25. Furthermore, the object or object table will no longer come into direct contact with the material of the grounding layer 60, so it is no longer necessary to perform roughening of the grounding layer 60 in order to prevent sticking of the object or object table. The choice of material is no longer therefore constrained by the need for compatibility with the roughening process. For example, there is no longer any need for the material to be compatible with an ion beam figuring wet etching process.

Furthermore, there is no longer any need to perform such a roughening process on the grounding layer 60. Manufacture of the grounding layer 60 is therefore simplified. A large thickness for the grounding layer is no longer required as the grounding layer 60 does not need to accommodate a roughening treatment, nor will the thickness of the grounding layer be used to tune flatness by adjusting the heights of the protrusions. The grounding layer 60 can therefore be made thinner, which reduces the chances of delamination of the grounding layer 60. Decreasing the chances of delamination may improve reliability and/or manufacturing yield.

FIG. 26 depicts an example embodiment which is the same as the arrangement of FIG. 25 except that instead of the grounding layer 60 being deposited on top of the dielectric layer 62 and the projections 52, the grounding layer 60 is formed as a layer that is on top of the dielectric layer 62 but beneath the projections 52. Such a structure may be manufactured for example by forming the grounding layer 60 before the projections 52. The projections 52 are then formed on top of the grounding layer 60. The grounding layer 60 is therefore formed such that a portion 67 of the grounding layer 60 is in between the dielectric layer 62 and at least one (optionally all) of the plurality of projections 52 (viewed perpendicular to the base surface 65). The portion 67 of the grounding layer 60 that is in between the dielectric layer 62 and a projection 52 can provide a good electrical connection between the grounding layer 60 and the projection 52.

FIG. 27 depicts an alternative embodiment. This embodiment is the same as the embodiment discussed above with reference to FIG. 26 except that an additional layer 64, which may be referred to as a "protective layer" 64, is formed on top of the grounding layer 60. In an embodiment the protective layer 64 is a dielectric. In this embodiment, the protective layer 64 extends partially underneath the projections 52. In other embodiments, the protective layer 64 may only extend (partially or completely) underneath a subset of the projections 52 or none of the projections 52. In such embodiments, the protective layer 64 may stop at the lateral boundaries of one or more of the projections 52 under which the protection layer 64 does not extend. In an embodiment, a conductive material 68 is provided in openings beneath one or more of the projections 52, within the protective layer 64, to provide an electrical connection between the grounding layer 60 and the projections 52. In an embodiment, the structure of FIG. 27 is manufactured by forming the grounding layer 60 in a first step. The protective layer 64 is formed in a second step, with openings at the expected locations of the projections 52. Conductive material 68 is then formed in the openings in a third step. Finally, the projections 52 are formed over the conductive material in the openings 68 in a fourth step. In an embodiment, the conductive material is formed from the same material as the grounding layer 60.

In an embodiment, the grounding layer 60 is provided at a thickness that is less than 1 micron, preferably less than 0.5 microns, preferably less than 0.3 microns, preferably less than 0.2 microns.

In the embodiments described above with reference to FIGS. 26 and 27, the grounding layer 60 is described as being formed on a dielectric layer 62 that is directly adjacent to a main body. However, other arrangements are possible. The grounding layer 60 may be formed on structures which are not dielectrics, for example. Alternatively or additionally, a multi-layer structure may be provided between the main body 48 and the grounding layer 60. For example, any of the layered structures discussed above with reference to FIGS. 9-24 may be provided in between the main body 48 and the grounding layer 60. Any one or more of the methods of providing a layered structure discussed above with reference to FIGS. 9-24 may be used to provide the layered structure on the main body 48.

In the embodiments discussed above with reference to FIGS. 26 and 27, the projections 52 were formed after formation of the grounding layer 60. However, this is not essential. In other embodiments, the projections are formed before the grounding layer 60. For example, the projections 52 may be formed by etching recesses. For example, the projections 52 may be formed by etching recesses in the material of the main body 48. The projections 52 may therefore be integral or not integral with the main body 48.

Example materials for the grounding layer 60 and the projections 52 are described below.

In an embodiment, the grounding layer 60 is formed from Cr or CrN. The thickness of the grounding layer may preferably be between 0.1 micron and 1 micron. In an embodiment, the grounding layer is adhered to a layer of $SiO_2$ (an example of a "dielectric layer").

In an embodiment, the distal ends 66 of the projections 52 are formed (or coated with) a DLC (diamond-like carbon), SiC, or CrN or any combination of these materials. In an embodiment, the projections have a height (in the direction perpendicular to the plane of the grounding plane) of about 10 microns.

The grounding layer 60 may be a continuous layer (with no openings or gaps) or may be patterned (for example in a similar manner to the so-called "Manhatten" pattern). The grounding layer 60 may be provided so that substantially all parts of the grounding layer are in the same plane or the grounding layer 60 may be provided in such a way that different parts of the grounding layer 60 are provided in different planes.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation and extreme ultraviolet (EUV) radiation (e.g. having a wavelength of or about 365, 248, 193, 157, 126, 13.5 or 6.5 nm).

The term "lens", where the context allows, may refer to any one or combination of various types of optical components, including refractive and reflective optical components.

While specific embodiments of the invention have been described above, it will be appreciated that the invention, at least in the form a method of operation of an apparatus as herein described, may be practiced otherwise than as described. For example, the embodiments of the invention, at least in the form of a method of operation of an apparatus, may take the form of one or more computer programs containing one or more sequences of machine-readable instructions describing a method of operating an apparatus as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or multiple processors are configured to communicate with at least one of the controllers. For example, each controller may include one or more processors for executing the computer programs that include machine-readable instructions for the methods of operating an apparatus described above. The controllers may include data storage media for storing such computer programs, and/or hardware to receive such media. So the controller(s) may operate according the machine readable instructions of one or more computer programs.

The invention may be applied to substrates with a diameter of 300 mm, 450 mm or any other size.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A method of manufacturing an object holder for use in a lithographic apparatus, the object holder comprising one or more electrically functional components, the method comprising:
    using a composite structure comprising a carrier sheet different from a main body of the object holder and a layered structure comprising one or a plurality of layers and formed on the carrier sheet;
    connecting the composite structure to a surface of the main body such that the layered structure is between the carrier sheet and the surface of the main body; and
    removing the carrier sheet from the composite structure, leaving the layered structure connected to the main body.

2. The method according to claim 1, wherein the carrier sheet comprises a surface containing silicon and the layered structure comprises a first layer formed by thermally oxidizing the surface of the carrier sheet.

3. The method according to claim 1, wherein the layered structure comprises one or more of the electrically functional components.

4. The method according to claim 1, wherein one or more of the electrically functional components is/are formed outside of the layered structure.

5. The method according to claim 1, wherein the one or more electrically functional components comprise one or more selected from: a heater, a sensor, and/or an electrode for electrostatically holding the object against the object holder or the object holder against an object table for supporting the object holder.

6. The method according to claim 5, wherein the one or more electrically functional components comprises the electrode and the electrode is formed in the main body of the object holder or to a side of the main body of the object holder opposite to where the layered structure is connected to the object holder.

7. The method according to claim 1, further comprising forming one or more projections configured to support an object on the layered structure, the one or more projections formed after removal of the carrier sheet from the composite structure.

8. The method according to claim 1, wherein a plurality of projections protrude from a surface of the main body for supporting the object, and the method further comprises:
    forming a plurality of indentations penetrating through the layered structure into the carrier sheet, prior to the connection of the composite structure to the surface of the main body, the plurality of indentations spatially complementing the plurality of projections such that when the composite structure is placed onto the main body the plurality of projections engage with the plurality of indentations.

9. The method according to claim 8, wherein end surfaces of the projections are brought into contact with the carrier sheet in the indentations.

10. The method according to claim 1, wherein the composite structure is connected to the surface of the main body via an adhesive layer formed between the composite structure and the surface of the main body.

11. The method according to claim 10, wherein:
the adhesive layer is omitted in a selected region between the composite structure and the surface of the main body so as to allow for the layered structure to be flexed relative to the main body in the selected region.

12. The method according to claim 11, wherein:
the main body is provided with a through-hole corresponding to the location of the selected region to allow for the layered structure to be fed through the through-hole in the selected region, thereby allowing an electrical connection to be made to the layered structure from a side of the main body opposite to the object.

13. A combination for manufacturing an object holder for use in a lithographic apparatus, the combination comprising:
a main body of the object holder; and
a composite structure comprising a carrier sheet different from the main body of the object holder and a layered structure comprising one or a plurality of layers and formed on the carrier sheet, wherein the composite structure is configured to connect to a surface of the main body such that the layered structure is between the carrier sheet and the surface of the main body, and configured such that the carrier sheet is removable from the composite structure, leaving the layered structure connected to the main body,
wherein the main body and/or the composite structure comprises one or more electrically functional components.

14. The combination according to claim 13, wherein the carrier sheet comprises a surface containing silicon and the layered structure comprises a first layer formed by thermal oxidization of the surface of the carrier sheet.

15. The combination according to claim 13, wherein the layered structure comprises one or more of the electrically functional components.

16. The combination according to claim 13, wherein one or more of the electrically functional components is/are formed outside of the layered structure.

17. The combination according to claim 13, wherein the one or more electrically functional components comprise one or more selected from: a heater, a sensor, and/or an electrode for electrostatically holding the object against the object holder or the object holder against an object table for supporting the object holder.

18. The combination according to claim 17, wherein the one or more electrically functional components comprises the electrode and the electrode is formed in the main body of the object holder or to a side of the main body of the object holder opposite to where the layered structure is connected to the object holder.

19. The combination according to claim 13, wherein:
the main body comprises a plurality of projections protrude from the surface of the main body and arranged to support the object, and
the layered structure comprises a plurality of indentations penetrating therethrough and into the carrier sheet, wherein the plurality of indentations spatially complement the plurality of projections such that when the composite structure is placed onto the main body the plurality of projections engage with the plurality of indentations.

20. The combination according to claim 13, further comprising an adhesive layer arranged to connect the surface of the main body to the composite structure.

* * * * *